United States Patent
Ogomi et al.

(10) Patent No.: US 11,639,974 B1
(45) Date of Patent: May 2, 2023

(54) MAGNETIC SENSOR DEVICE

(71) Applicant: Mitsubishi Electric Corporation, Tokyo (JP)

(72) Inventors: Tomokazu Ogomi, Tokyo (JP); Kazuki Yamauchi, Tokyo (JP); Kenji Shimohata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/916,076

(22) PCT Filed: Feb. 17, 2021

(86) PCT No.: PCT/JP2021/005989
§ 371 (c)(1),
(2) Date: Sep. 30, 2022

(87) PCT Pub. No.: WO2021/199757
PCT Pub. Date: Oct. 7, 2021

(30) Foreign Application Priority Data

Mar. 30, 2020 (JP) .............................. JP2020-060272

(51) Int. Cl.
*G01R 33/09* (2006.01)
*G07D 7/04* (2016.01)

(52) U.S. Cl.
CPC .............. *G01R 33/091* (2013.01); *G07D 7/04* (2013.01)

(58) Field of Classification Search
CPC ................................ G01R 33/091; G07D 7/04
See application file for complete search history.

(56) References Cited

U.S. PATENT DOCUMENTS 10,663,320 B2 * 5/2020 Kahara ................ G01R 33/091
2006/0279280 A1 12/2006 Minamitani et al.
(Continued)

FOREIGN PATENT DOCUMENTS

JP   61-265691 A   11/1986
JP   2001-21631 A   1/2001
(Continued)

OTHER PUBLICATIONS

International Search Report and Written Opinion dated May 18, 2021, received for PCT Application PCT/JP2021/005989, filed on Feb. 17, 2021, 11 pages including English Translation.
(Continued)

*Primary Examiner* — Reena Aurora
(74) *Attorney, Agent, or Firm* — Xsensus LLP

(57) ABSTRACT

A first magnetic field generator generates a magnetic field intersecting a detection object being transported along a transport path. A second magnetic field generator opposite to the first magnetic field generator with respect to the transport path generates a magnetic field intersecting the detection object. A first magnetoresistive element between the first magnetic field generator and the transport path outputs, as a change in resistance, a change in magnetic flux density produced by transport of the detection object. The first and second magnetic field generators are different in a magnetic pole facing the transport path and are arranged with a center of the first magnetic field generator in a transport direction of the detection object and a center of the second magnetic field generator in the transport direction are located at mutually different positions. The first magnetoresistive element includes a first resistor and a second resistor arranged with spacing therebetween.

20 Claims, 11 Drawing Sheets

(56) References Cited

U.S. PATENT DOCUMENTS

| | | |
|---|---|---|
| 2014/0028308 A1 | 1/2014 | Ogomi et al. |
| 2014/0191035 A1* | 7/2014 | Paul .................. G07D 7/04 |
| | | 235/450 |
| 2017/0052233 A1 | 2/2017 | Ogomi et al. |
| 2017/0187896 A1 | 6/2017 | Ogomi et al. |
| 2017/0205474 A1* | 7/2017 | Ogomi ............... G07D 7/04 |

FOREIGN PATENT DOCUMENTS

| | | |
|---|---|---|
| JP | 2005-214789 A | 8/2005 |
| JP | 2012-255770 A | 12/2012 |
| JP | 2015-10902 A | 1/2015 |
| JP | 2016-206069 A | 12/2016 |
| WO | 2005/083457 A1 | 9/2005 |
| WO | 2010/052797 A1 | 5/2010 |
| WO | 2015/174409 A1 | 11/2015 |
| WO | 2016/052613 A1 | 4/2016 |

OTHER PUBLICATIONS

Decision to Grant dated Oct. 19, 2021, received for JP Application 2021-542557, 5 pages including English Translation.

* cited by examiner

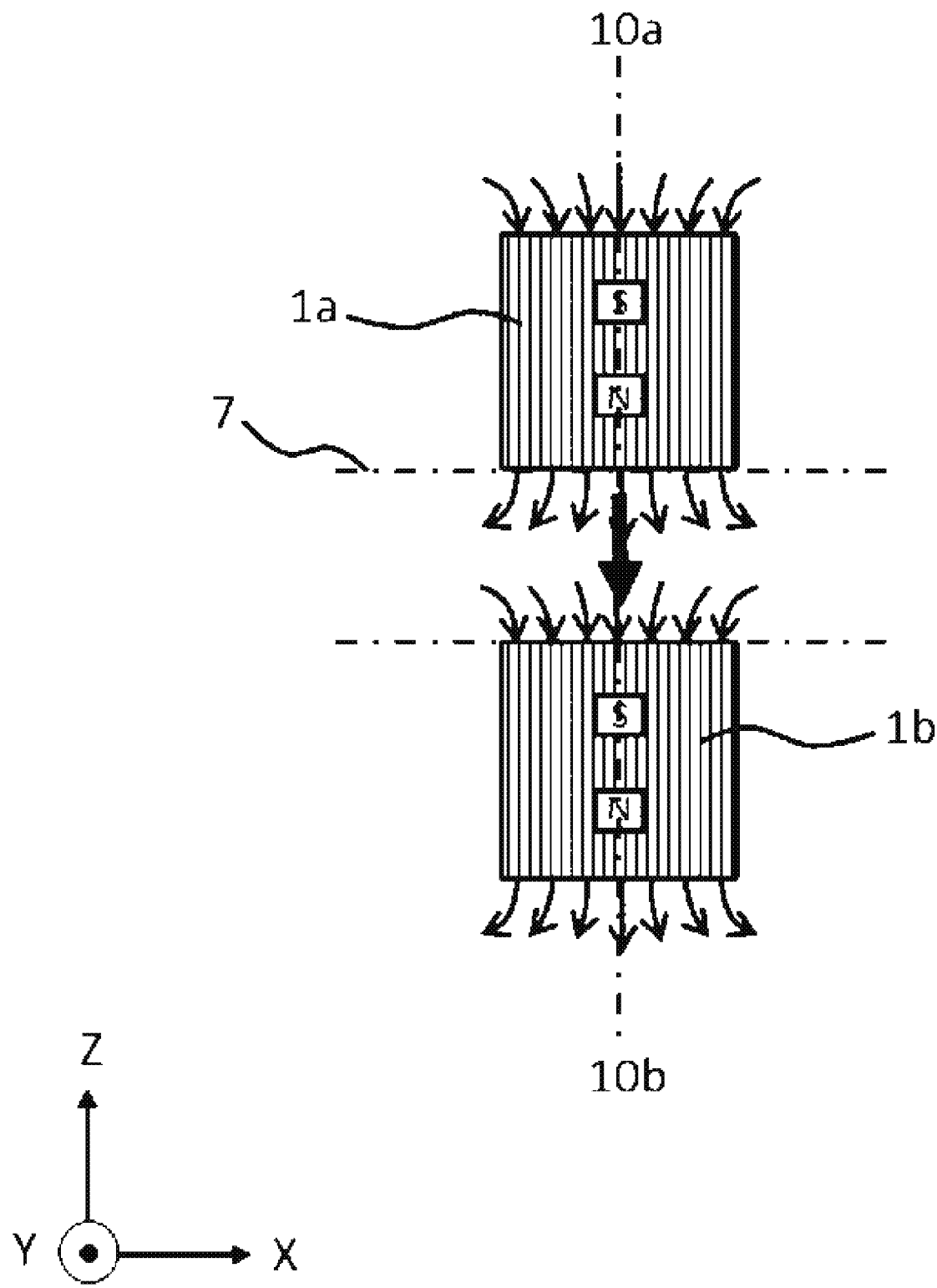

MAGNETIC SENSOR DEVICE

CROSS-REFERENCE TO RELATED APPLICATIONS

The present application is based on PCT filing PCT/JP2021/005989, filed Feb. 17, 2021, which claims priority to JP 2020-060272, filed Mar. 30, 2020, the entire contents of each are incorporated herein by reference.

TECHNICAL FIELD

The present disclosure relates to a magnetic sensor device.

BACKGROUND ART

A magnetic sensor device includes magnetoresistive elements with resistances that change in accordance with magnetic field strength and detects a magnetic pattern on a detection object as a paper sheet such as a banknote. Such a magnetic sensor device has a known structure to transport a detection object in a contactless manner to increase processing capability. Patent Literature 1 describes a magnetic sensor device for transporting a detection object in a contactless manner. The magnetic sensor device includes magnetic field generators facing each other across a transport path for a detection object and magnetoresistive elements facing each other across the transport path.

CITATION LIST

Patent Literature

Patent Literature 1: Unexamined Japanese Patent Application Publication No. 2001-21631

SUMMARY OF INVENTION

Technical Problem

In the magnetic sensor device described in Patent Literature 1, the magnetic field generators facing each other each apply a bias magnetic field in a direction perpendicular to the transport direction. Thus, a detection object receives a weak magnetic field applied in the transport direction. Since the magnetoresistive elements included in the magnetic sensor device detect a change in a magnetic field in the transport direction and thus output from the magnetoresistive elements is small, detecting a magnetic pattern on the detection object is difficult.

In response to the above issue, an objective of the present disclosure is to provide a magnetic sensor device that efficiently detects a magnetic pattern on a detection object.

Solution to Problem

A magnetic sensor device according to the present disclosure includes a first magnetic field generator to generate a magnetic field intersecting a detection object being transported along a transport path, a second magnetic field generator is disposed at opposite side to the first magnetic field generator with respect to the transport path to generate a magnetic field intersecting the detection object, and a first magnetoresistive element disposed between the first magnetic field generator and the transport path to output, as a change in resistance, a change in magnetic flux density produced by transport of the detection object along the transport path. The first magnetic field generator and the second magnetic field generator are different in a magnetic pole thereof facing the transport path and are arranged such that a center of the first magnetic field generator in a transport direction of the detection object and a center of the second magnetic field generator in the transport direction are located at mutually different positions. The first magnetoresistive element includes a first resistor and a second resistor arranged in the transport direction. The first resistor and the second resistor are arranged with a spacing therebetween, and a midpoint of the spacing in the transport direction is located at a position different from the position of the center of the first magnetic field generator in the transport direction.

Advantageous Effects of Invention

According to the present disclosure, the first magnetic field generator and the second magnetic field generator are arranged such that the center of the first magnetic field generator in the transport direction and the center of the second magnetic field generator in the transport direction are located at mutually different positions, enabling application to a detection object of a larger magnetic field in the transport direction. Thus, a magnetic sensor device that efficiently detects a magnetic pattern on a detection object can be obtained.

BRIEF DESCRIPTION OF DRAWINGS

FIG. 4A illustrates distribution of magnetic fields generated by a first magnetic field generator and a second magnetic field generator in a magnetic sensor device according to a comparative example;

A magnetic sensor device according to one or more embodiments of the present disclosure is described with reference to the drawings. Hereafter, X-direction is defined as the transport direction of a detection object, or the lateral direction of the magnetic sensor device, Y-direction as the longitudinal direction of the magnetic sensor device orthogonal to the transport direction of a detection object, or the reading width direction, and Z-direction as the direction perpendicular to an XY plane being a transport surface. These directions are referred to as appropriate.

Embodiment 1

Figure 1:
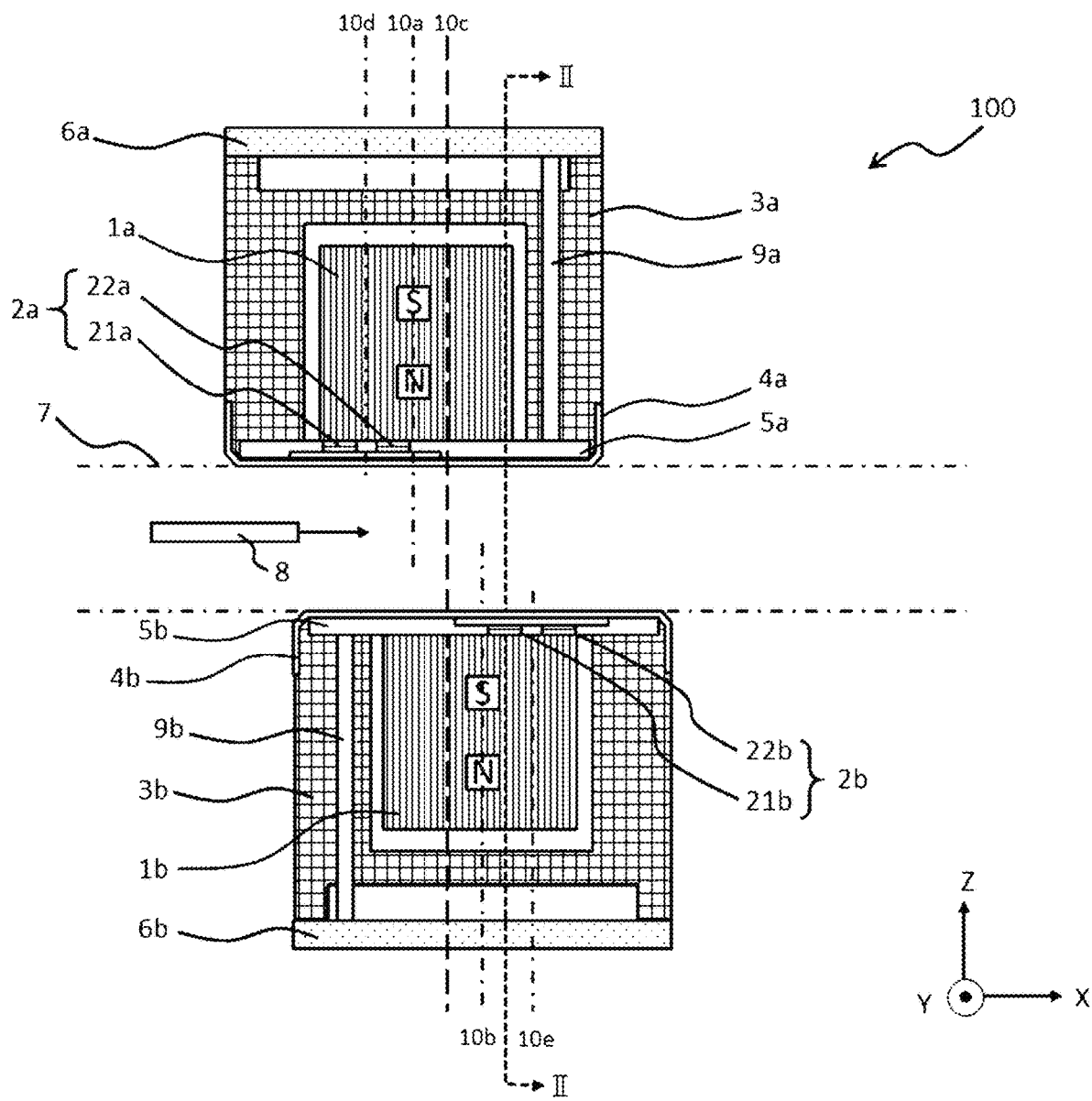
FIG. 1 is a Z-X cross-sectional view of a magnetic sensor device according to Embodiment 1 as viewed in Y-direction.
Figure 2:
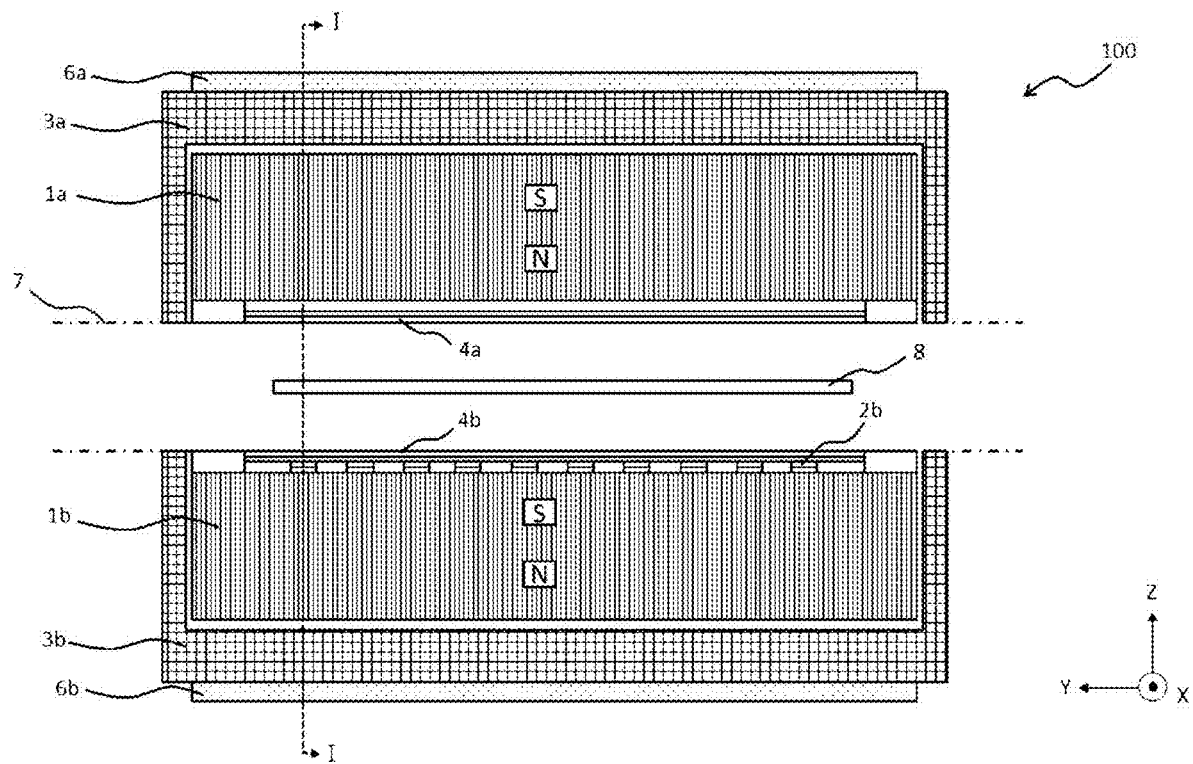
FIG. 2 is a Y-Z cross-sectional view of the magnetic sensor device according to Embodiment 1.

FIG. 1 is a Z-X cross-sectional view of a magnetic sensor device 100 according to Embodiment 1 as viewed in Y-direction. FIG. 2 is a Y-Z cross-sectional view of the magnetic sensor device 100. FIG. 1 corresponds to a cross section taken along line I-I in FIG. 2. FIG. 2 corresponds to a cross section taken along line II-II in FIG. 1.

As illustrated in FIGS. 1 and 2, the magnetic sensor device 100 that detects a magnetic pattern on a detection object 8 as a paper sheet such as a banknote includes a first magnetic field generator 1a and a second magnetic field generator 1b for generating a bias magnetic field and a first magnetoresistive element 2a and a second magnetoresistive element 2b for outputting a change in magnetic flux density as a change in resistance. The magnetic sensor device 100 also includes a housing 3a accommodating the first magnetic field generator 1a, a metal shield plate 4a, a circuit board 5a on which the first magnetoresistive element 2a is mounted, a signal processing circuit board 6a connected to the circuit board 5a, a housing 3b accommodating the second magnetic field generator 1b, a metal shield plate 4b, a circuit board 5b on which the second magnetoresistive element 2b is mounted, and a signal processing circuit board 6b connected to the circuit board 5b.

The first magnetic field generator 1a and the second magnetic field generator 1b generate magnetic fields intersecting the detection object 8 being transported along a transport path 7. The detection object 8 is a sheet, such as a banknote, having a magnetic pattern printed with magnetic ink including a magnetic material. The detection object 8 is transported in the positive X-direction. The second magnetic field generator 1b is disposed at opposite side to the first magnetic field generator 1a with respect to the transport path 7. The first magnetic field generator 1a and the second magnetic field generator 1b are permanent magnets each having the north pole and the south pole in Z-direction and being rectangular, or specifically long in Y-direction and short in X-direction. In the present embodiment, the first magnetic field generator 1a and the second magnetic field generator 1b are neodymium bonded magnets. The first magnetic field generator 1a applies a bias magnetic field to the first magnetoresistive element 2a. The second magnetic field generator 1b applies a bias magnetic field to the second magnetoresistive element 2b.

The first magnetic field generator 1a and the second magnetic field generator 1b are arranged so as to be different in a magnetic pole thereof facing the transport path 7. In the present embodiment, the magnetic pole of the first magnetic field generator 1a facing the transport path 7 is the north pole, and the magnetic pole of the second magnetic field generator 1b facing the transport path 7 is the south pole. However, the magnetic poles may be reversed.

Figure 3A:
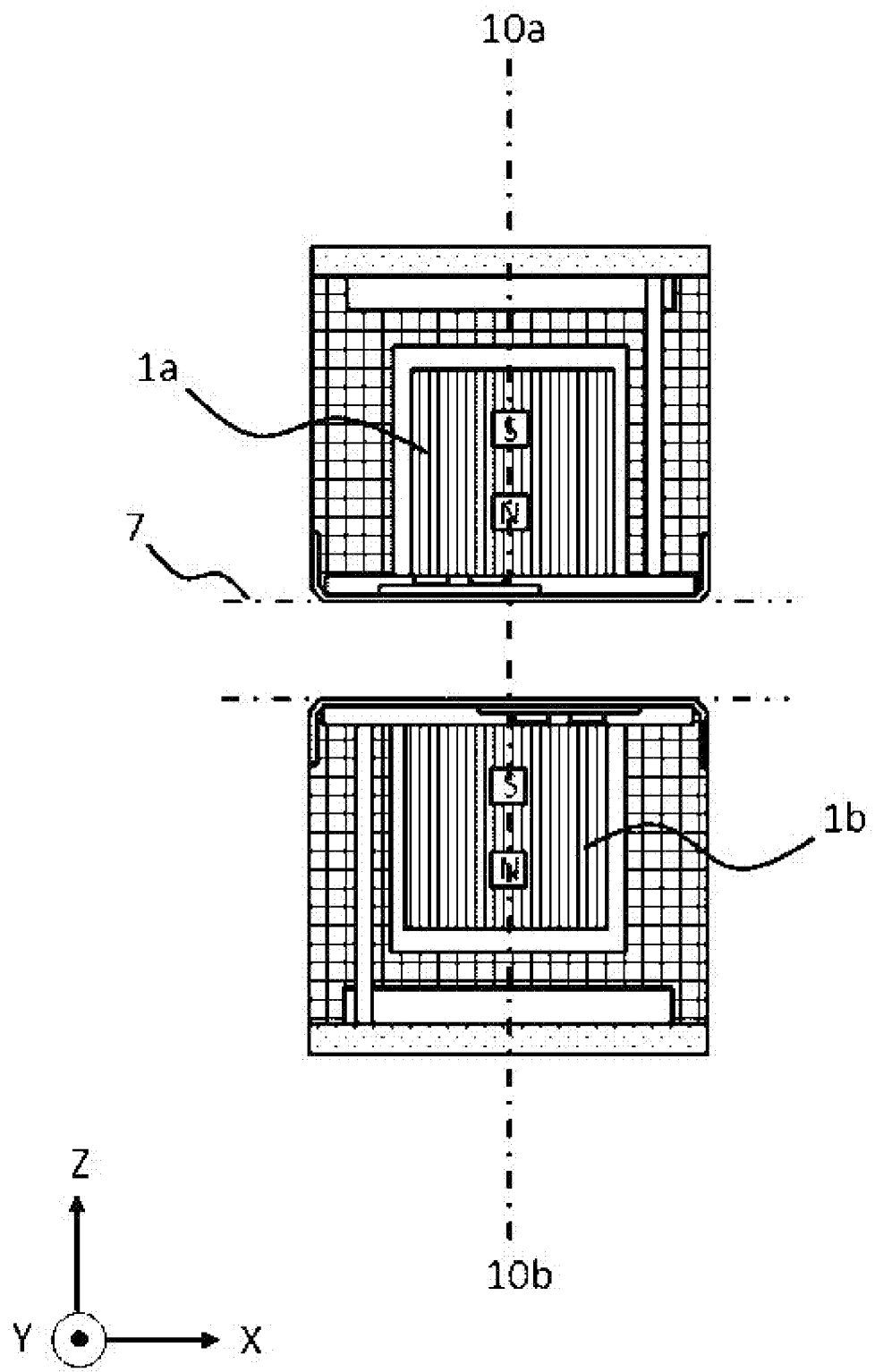
FIG. 3A is a diagram describing the position of a second magnetic field generator relative to a first magnetic field generator in the magnetic sensor device according to Embodiment 1.
Figure 3B:
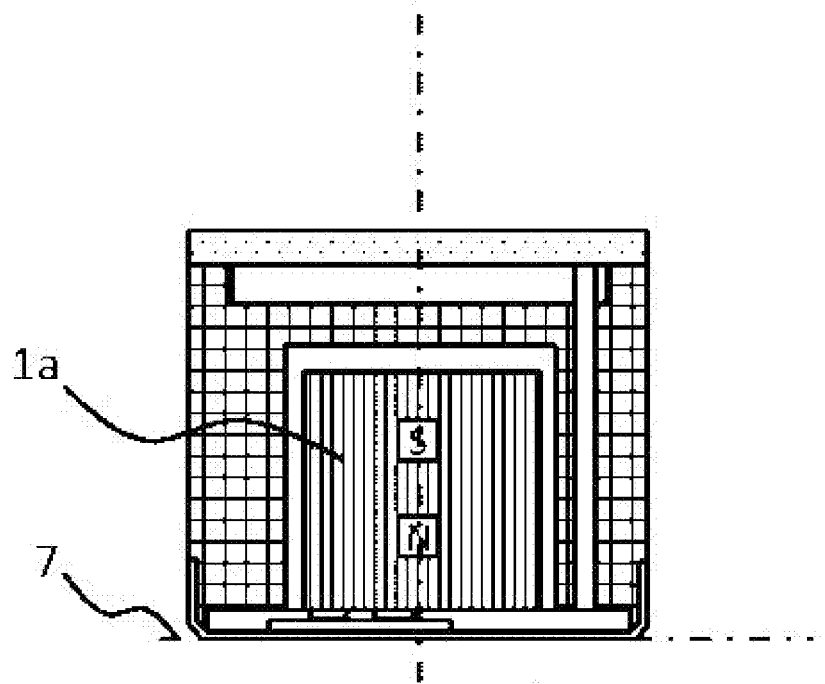
FIG. 3B is a diagram describing the position of the second magnetic field generator relative to the first magnetic field generator in the magnetic sensor device according to Embodiment 1.
Figure 3C:
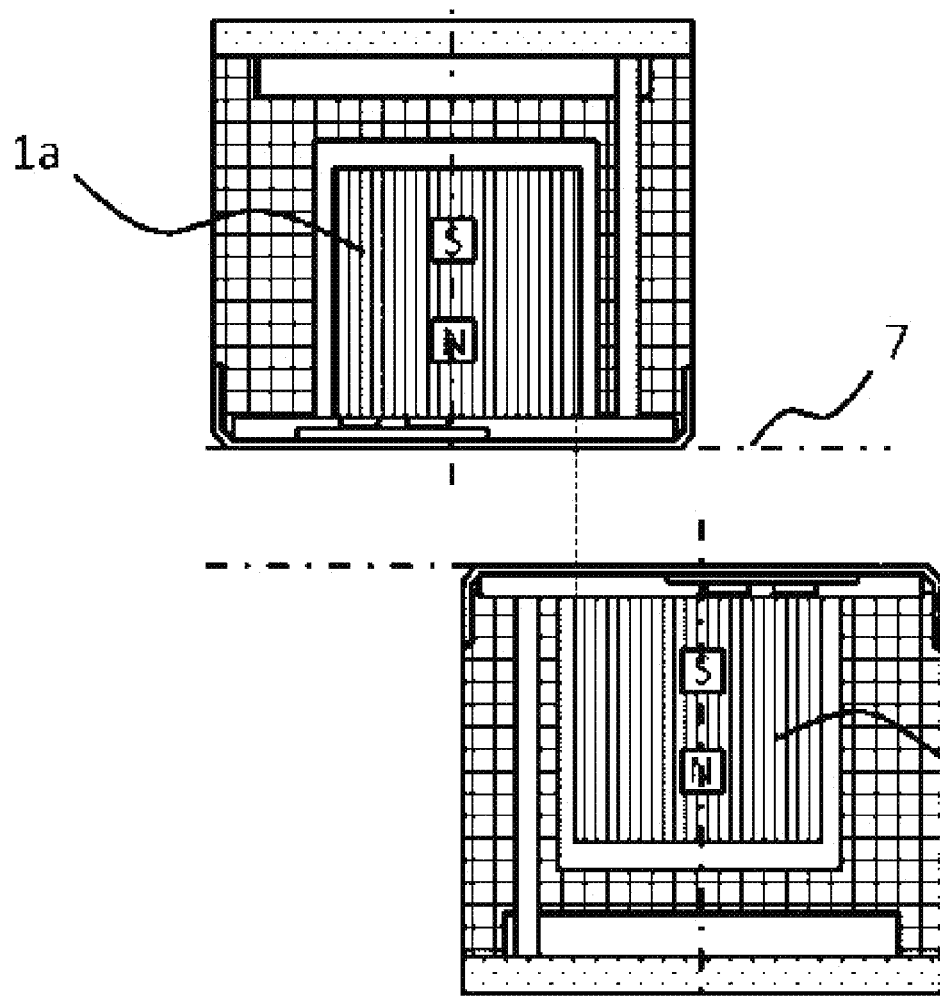
FIG. 3C is a diagram describing the position of the second magnetic field generator relative to the first magnetic field generator in the magnetic sensor device according to Embodiment 1.

The first magnetic field generator 1a and the second magnetic field generator 1b are arranged such that a center of the first magnetic field generator 1a in X-direction as a transport direction and a center of the second magnetic field generator 1b in X-direction are located at mutually different positions. More specifically, a center line 10a as the center of the first magnetic field generator 1a in X-direction and a center line 10b as the center of the second magnetic field generator 1b in X-direction are out of alignment with each other in X-direction. The first magnetic field generator 1a and the second magnetic field generator 1b are disposed to face each other partially in X-direction across the transport path 7. FIGS. 3A to 3C are diagrams describing the range for the position of the second magnetic field generator 1b relative to the first magnetic field generator 1a. FIG. 3A illustrates the first magnetic field generator 1a and the second magnetic field generator 1b with the center lines 10a and 10b aligned with each other. FIG. 3B illustrates the first magnetic field generator 1a and the second magnetic field generator 1b with the center line 10b shifted in the positive X-direction relative to the center line 10a. FIG. 3C illustrates the first magnetic field generator 1a and the second magnetic field generator 1b with the center line 10b shifted by the maximum distance relative to the center line 10a. With the center line 10b shifted more in the positive X-direction than the position in FIG. 3C relative to the center line 10a, the first magnetic field generator 1a and the second magnetic field generator 1b do not face each other in X-direction across the transport path 7. This reduces the magnetic field applied in X-direction. The first magnetic field generator 1a and the second magnetic field generator 1b are thus disposed with the center line 10b shifted from the position in FIG. 3A relative to the center line 10a. The first magnetic field generator 1a and the second magnetic field generator 1b with the center line 10b shifted by the maximum distance are disposed at the positions in FIG. 3C.

Figure 4B:
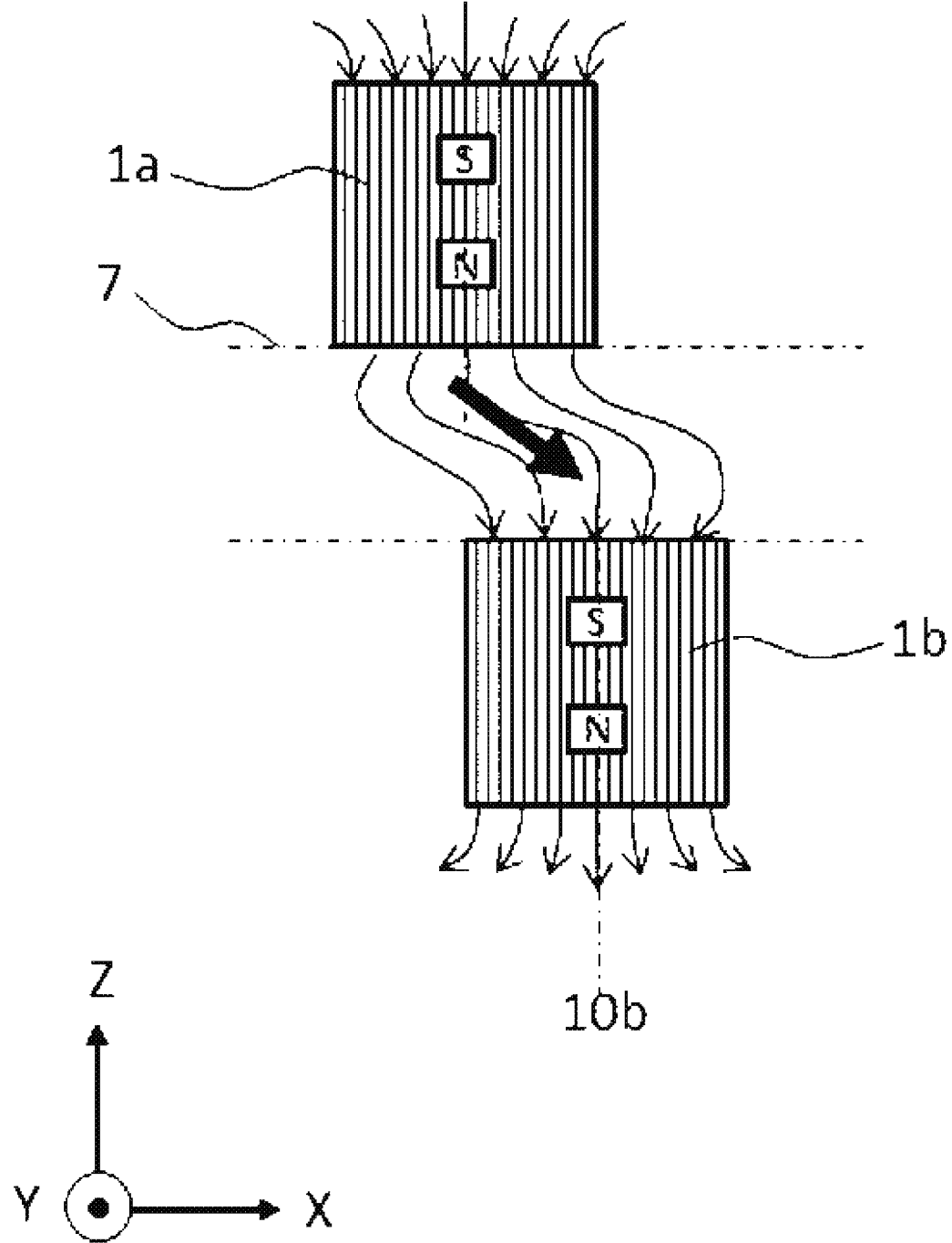
FIG. 4B illustrates distribution of magnetic fields generated by the first magnetic field generator and the second magnetic field generator in the magnetic sensor device according to Embodiment 1.

The above structure allows the first magnetic field generator 1a and the second magnetic field generator 1b to apply an increased magnetic field in X-direction in the transport path 7. FIGS. 4A and 4B each illustrate the distribution of the magnetic fields generated by the first magnetic field generator 1a and the second magnetic field generator 1b. In FIGS. 4A and 4B, the components relevant to the distribution of the magnetic fields are illustrated, and the other components are no illustrated. FIG. 4A illustrates the distribution of the magnetic fields in the transport path 7 in a comparative example in which the center of the first magnetic field generator 1a in X-direction and the center of the second magnetic field generator 1b in X-direction are aligned. FIG. 4B illustrates the distribution of the magnetic fields in the transport path 7 in the magnetic sensor device 100. The arrows in the figures indicate magnetic field lines. As illustrated in FIGS. 4A and 4B, a magnetic field is applied in Z-direction in the transport path 7 in FIG. 4A. A magnetic field is applied in X- and Z-directions in the transport path 7 in FIG. 4B. More specifically, the structure of the magnetic sensor device 100 can apply a larger magnetic field in X-direction than in the case in which the center of first magnetic field generator 1a in X-direction and the center of the second magnetic field generator 1b in X-direction are aligned.

Referring back to FIGS. 1 and 2, the first magnetoresistive element 2a is disposed between the first magnetic field generator 1a and the transport path 7. The first magnetoresistive element 2a outputs, as a change in resistance, a change in the magnetic flux density produced by transport of the detection object 8 along the transport path 7. Multiple first magnetoresistive elements 2a are arranged in Y-direction. Similarly, the second magnetoresistive element 2b is disposed between the second magnetic field generator 1b and the transport path 7. The second magnetoresistive element 2b outputs, as a change in resistance, a change in the magnetic flux density produced by transport of the detection object 8 along the transport path 7. Multiple second magnetoresistive elements 2b are arranged in Y-direction. The first magnetoresistive element 2a and the second magnetoresistive element 2b include anisotropic magnetoresistive (AMR) elements, giant magnetoresistive (GMR) elements, or tunnel magnetoresistive (TMR) elements. To receive a large bias magnetic field being applied, the first magnetoresistive element 2a and the second magnetoresistive element 2b may be TMR elements. In particular, for the detection object 8 having a magnetic pattern including a binary dot pattern formed based on whether the detection object 8 contains a magnetic material, the first magnetoresistive element 2a and the second magnetoresistive element 2b may be TMR elements. The first magnetoresistive element 2a and the second magnetoresistive element 2b are described in detail later.

The housings 3a and 3b are formed from a non-magnetic material such as resin, ceramic, or non-magnetic metal. The housings 3a and 3b are boxes each having an opening in the upper surface. The housing 3a accommodates the first magnetic field generator 1a. Similarly, the housing 3b accommodates the second magnetic field generator 1b. The metal shield plate 4a covers and protects the circuit board 6a and the surfaces of the first magnetoresistive elements 2a facing the transport path for the detection object 8. Similarly, the metal shield plate 4b covers and protects the circuit board 6b and the surfaces of the second magnetoresistive elements 2b facing the transport path for the detection object 8. The metal shield plates 4a and 4b are not magnetized and transmit magnetic field lines.

Figure 5:
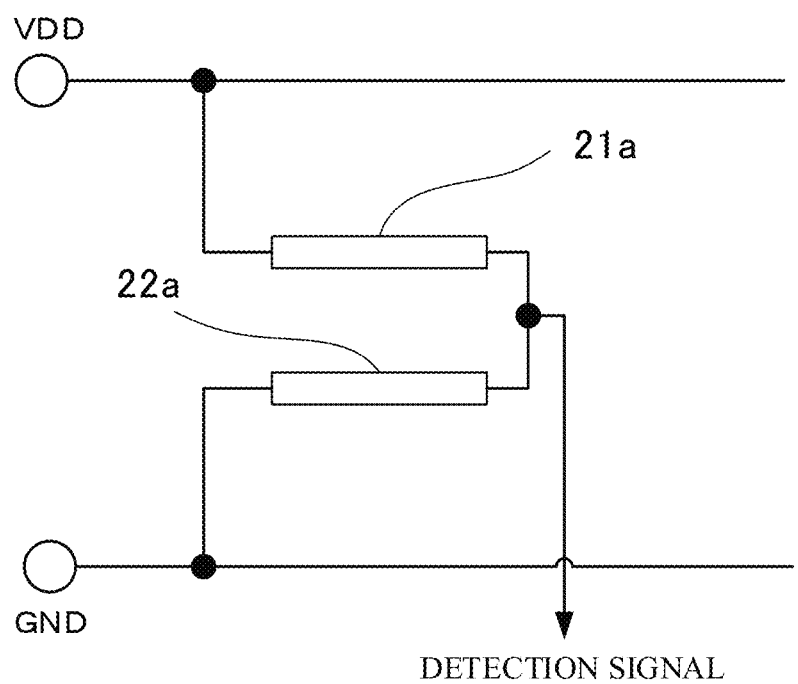
FIG. 5 is a circuit diagram of a circuit board included in the magnetic sensor device according to Embodiment 1.

The circuit board 5a is disposed on the upper surface of the first magnetic field generator 1a to surround the first magnetoresistive elements 2a. As illustrated in FIG. 5, the circuit board 5a applies a power supply voltage VDD and a grounding voltage GND to the first magnetoresistive elements 2a and outputs detection signals indicating changes in the resistance of the first magnetoresistive elements 2a. More specifically, the first magnetoresistive elements 2a each include a first resistor 21a and a second resistor 22a as described later. The circuit board 5a applies the power supply voltage VDD to one end of each first resistor 21a. The circuit board 5a applies the grounding voltage GND to one end of each second resistor 22a. The other ends of first resistor 21a and the second resistor 22a are short-circuited to output, to the circuit board 5a through an output signal line, output from each of the pair. In this structure, the power supply voltage VDD is divided at the ratio between the resistance of the first resistor 21a and the resistance of the second resistor 22a and is outputted to the output signal line as a detection signal. When the detection object 8 containing a magnetic material passes along the transport path 7, the magnetic field applied to each of the first resistors 21a and each of the second resistors 22a changes. The resistances of the first resistors 21a and the resistances of the second resistors 22a change accordingly, thus changing the voltage division ratio of each pair and changing the voltages of the detection signals. The circuit board 5a transmits the detection signals to the signal processing circuit board 6a. The signal processing circuit board 6a processes the detection signals to detect the magnetic pattern on the detection object 8. Similarly, the circuit board 5b is disposed on the upper surface of the second magnetic field generator 1b to surround the second magnetoresistive elements 2b. The circuit board 5b applies the power supply voltage VDD and the grounding voltage GND to the second magnetoresistive elements 2b and outputs the detection signals indicating changes in the resistance of the second magnetoresistive elements 2b. Other details of the circuit board 5b are similar to those of the circuit board 5a.

The signal processing circuit board 6a is disposed under the housing 3a and connected to the circuit board 5a with a cable 9a. The signal processing circuit board 6a processes the detection signals outputted by the circuit board 5a to detect the magnetic pattern on the detection object 8. Similarly, the signal processing circuit board 6b is disposed under the housing 3b and connected to the circuit board 5b with a cable 9b. The signal processing circuit board 6b processes the detection signals outputted by the circuit board 5b to detect the magnetic pattern on the detection object 8.

Although not illustrated, the magnetic sensor device 100 may include yokes that are soft magnetic plates such as iron plates. The yokes are connected to the first magnetic field generator 1a and the second magnetic field generator 1b. The yokes transmit magnetic fluxes generated by the first magnetic field generator 1a and the second magnetic field generator 1b.

The first magnetoresistive elements 2a each include the first resistor 21a and the second resistor 22a arranged in X-direction. The first resistor 21a and the second resistor 22a are arranged with a spacing therebetween, and a midpoint of the spacing in X-direction is located at a position different from the position of the center of the first magnetic field generator 1a in X-direction. More specifically, a center line 10d as the midpoint of the spacing between the first resistor 21a and the second resistor 22a in X-direction is farther from the center line 10b as the center of the second magnetic field generator 1b in X-direction than from the center line 10a as the center of the first magnetic field generator 1a in X-direction. Similarly, the second magnetoresistive elements 2b each include a third resistor 21b and a fourth resistor 22b arranged in X-direction. The third resistor 21b and the fourth resistor 22b are arranged with a spacing therebetween, and a midpoint of the spacing in X-direction is located at a position different from the position of the center of the second magnetic field generator 1b in X-direction. More specifically, a center line 10e as the midpoint of the spacing between the third resistor 21b and the fourth resistor 22b in X-direction is farther from the center line 10a as the center of the first magnetic field generator 1a in X-direction than from the center line 10b as the center of the second magnetic field generator 1b in X-direction.

Figure 6:
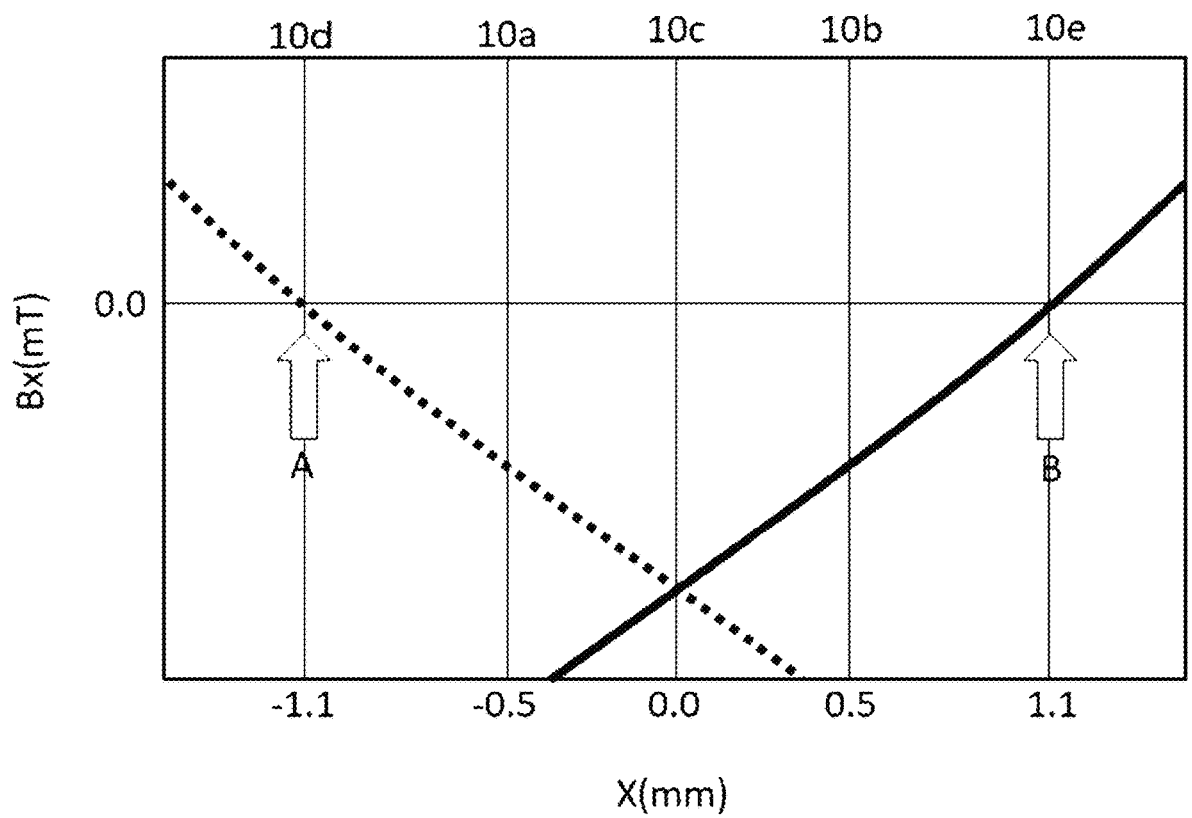
FIG. 6 is a graph showing the positions of a first magnetoresistive element and a second magnetoresistive element in the magnetic sensor device according to Embodiment 1 in X-direction.

The first resistor 21a and the second resistor 22a are bridge-connected on the circuit board 5a. Similarly, the third resistor 21b and the fourth resistor 22b are bridge-connected on the circuit board 5b. FIG. 6 is a graph showing magnetic flux density Bx in X-direction at the positions of a first magnetoresistive element 2a and a second magnetoresistive element 2b in X-direction. The vertical axis indicates the magnetic flux density Bx that represents the strength of a bias magnetic field in X-direction, and the horizontal axis indicates the position of each magnetoresistive element in X-direction. On the horizontal axis, the position of a center line 10c that is in the middle between the center lines 10a and 10b in X-direction is set to 0. The broken line indicates the bias magnetic field applied to the first magnetoresistive element 2a. The solid line indicates the bias magnetic field applied to the second magnetoresistive element 2b. In FIG. 6, the first magnetic field generator 1a and the second magnetic field generator 1b each have a length of 6 mm in X-direction, the center line 10a is shifted from the center line 10c by −0.5 mm in X-direction, and the center line 10b is shifted from the center line 10c by 0.5 mm in X-direction.

As shown in the graph in FIG. 6, to apply a positive magnetic field to the first resistor 21a and a negative magnetic field to the second resistor 22a, the center line 10d may be, in X-direction, at the position indicated by an arrow A in the graph. With the center line 10d at the position indicated by the arrow A, the first resistor 21a is disposed in the negative X-direction from the position indicated by the arrow A and thus receives a positive magnetic flux being applied. Similarly, the second resistor 22a is disposed in the positive X-direction from the position indicated by the arrow A and thus receives a negative magnetic flux being applied. Similarly, to apply a negative magnetic flux to a third resistor 21b and a positive magnetic flux to a fourth resistor 22b, the center line 10e may be, in X-direction, at the position indicated by an arrow B in the graph. With the center line 10e at the position indicated by the arrow B, the third resistor 21b is disposed in the negative X-direction from the position indicated by the arrow B and thus receives a negative magnetic flux being applied. Similarly, the fourth resistor 22b is disposed in the positive X-direction from the position indicated by the arrow B and thus receives a positive magnetic flux being applied. In other words, as shown in the graph, the center line 10d may be farther from the center line 10b than from the center line 10a. Similarly, the center line 10e may be farther from the center line 10a than from the center line 10b.

In the present embodiment, the center line 10a is shifted from the center line 10c by −0.5 mm in X-direction, and the center line 10b is shifted from the center line 10c by 0.5 mm in X-direction. However, the appropriate positions of the center lines 10d and 10e change in accordance with the distances by which the center lines 10a and 10b are shifted from the center line 10c. Thus, the positions of the center lines 10d and 10e may be appropriately determined in accordance with the distances by which the center lines 10a and 10b are shifted from the center line 10c. In this manner, when the accuracy of the distances by which the center lines of the first magnetic field generator 1a and the second magnetic field generator 1b are shifted is low, intended output from the magnetoresistive elements can be obtained by adjusting the positions of the center lines 10d and 10e.

Although the structure according to the present embodiment includes both the first magnetoresistive elements 2a and the second magnetoresistive elements 2b, the structure may include either the first magnetoresistive elements 2a or the second magnetoresistive elements 2b as appropriate.

The magnetic sensor device 100 according to Embodiment 1 can apply a larger magnetic field in X-direction in the transport path 7. This increases a change in the magnetic field outputted by a magnetoresistive element in X-direction as the transport direction. The magnetic sensor device 100 can thus detect the magnetic pattern on the detection object 8 efficiently. Multiple magnetic sensor devices 100 arranged in Y-direction can detect a two-dimensional magnetic pattern on the detection object 8 being transported in the positive X-direction.

Embodiment 2

Figure 7:
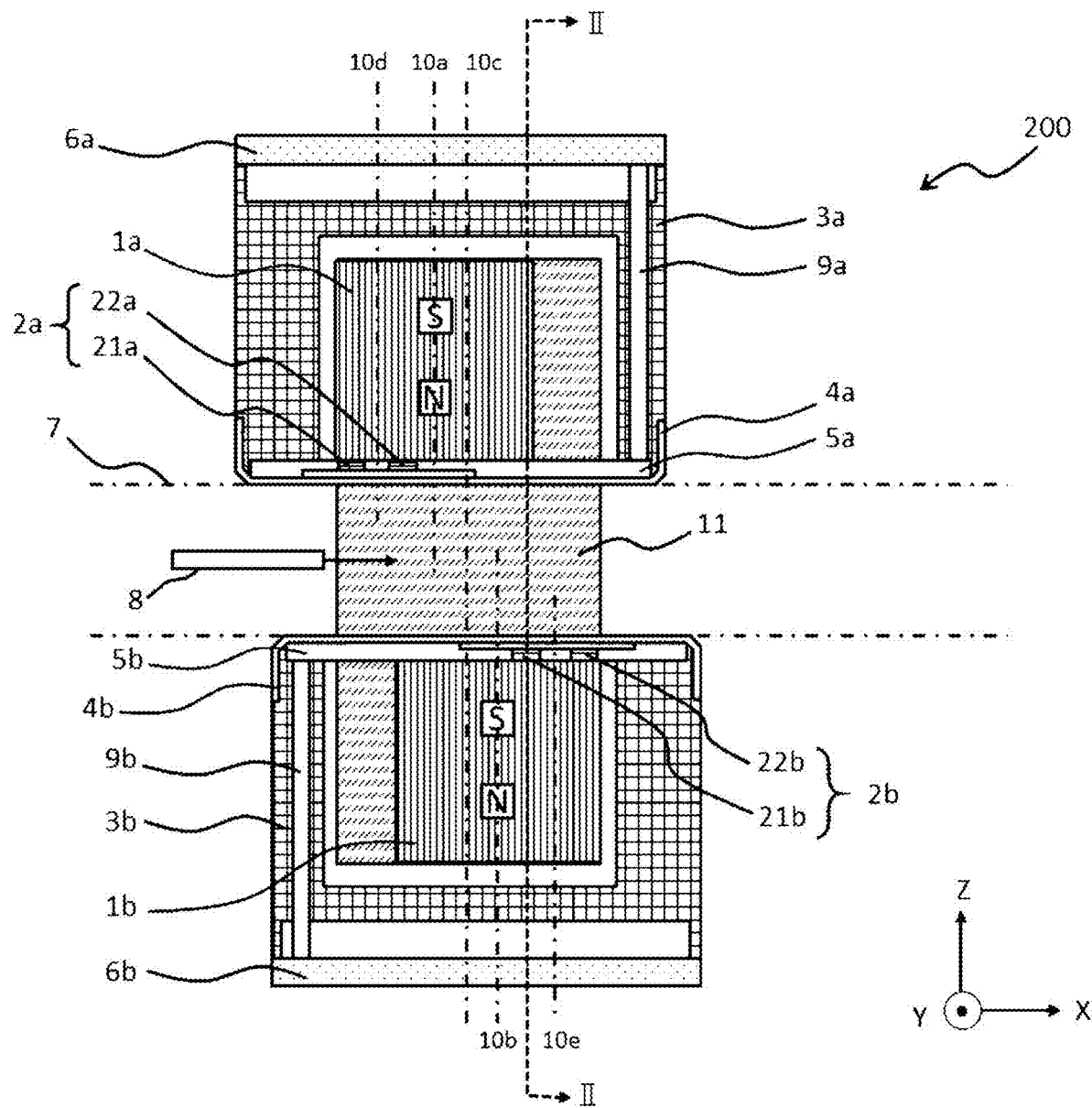
FIG. 7 is a Z-X cross-sectional view of a magnetic sensor device according to Embodiment 2 as viewed in Y-direction.
Figure 8:
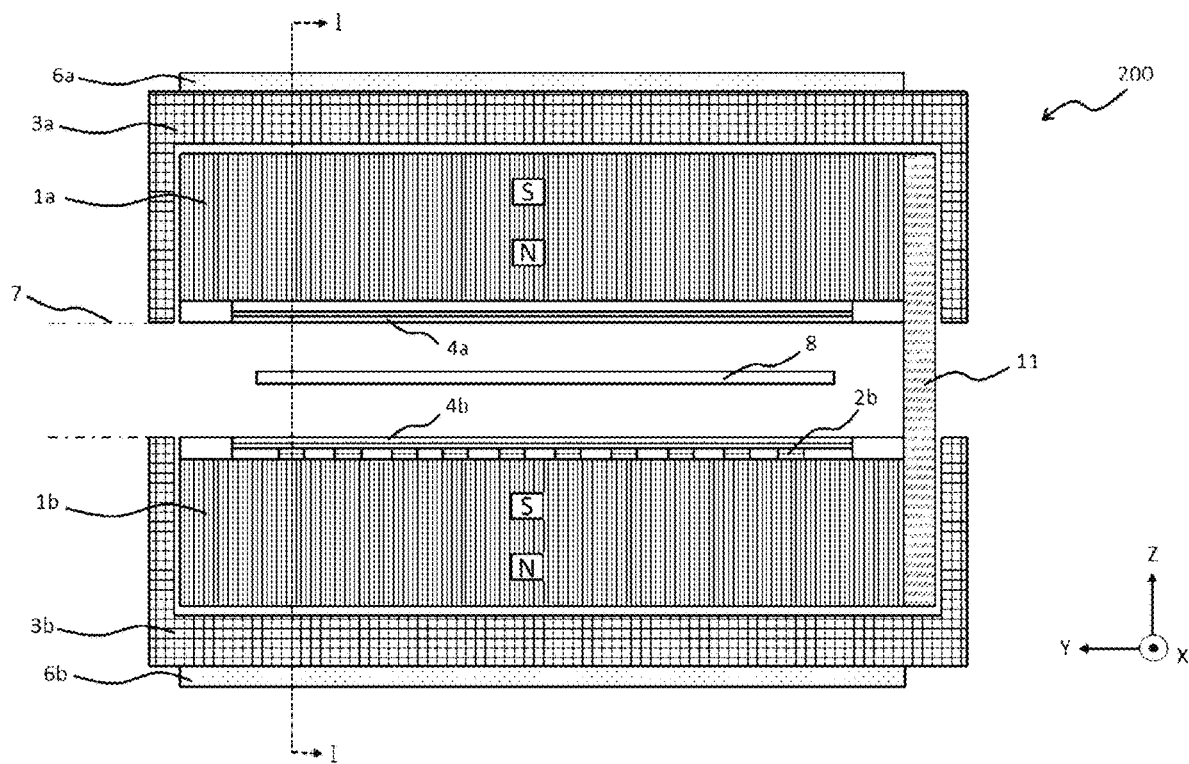
FIG. 8 is a Y-Z cross-sectional view of the magnetic sensor device according to Embodiment 2.

A magnetic sensor device 200 according to Embodiment 2 is described with reference to the drawings. FIG. 7 is a Z-X cross-sectional view of the magnetic sensor device 200 according to Embodiment 2 as viewed in Y-direction. FIG. 8 is a Y-Z cross-sectional view of the magnetic sensor device 200 according to Embodiment 2. FIG. 7 corresponds to a cross section taken along line I-I in FIG. 8. FIG. 8 corresponds to a cross section taken along line II-II in FIG. 7. The magnetic sensor device 200 according to Embodiment 2 is a magnetic sensor device 100 further including a fixture 11. The other components are substantially the same as in Embodiment 1. Like reference signs denote like or corresponding structural elements in the above embodiment. Such elements are not be described repeatedly.

The fixture 11 is formed from a non-magnetic material. The fixture 11 is connected to an end of the first magnetic field generator 1a in Y-direction intersecting X-direction. The fixture 11 is connected to an end of the second magnetic field generator 1b in Y-direction intersecting X-direction. This connects the first magnetic field generator 1a and the second magnetic field generator 1b with the fixture 11. This facilitates positioning of the first magnetic field generator 1a and the second magnetic field generator 1b, thus reducing positioning errors during manufacture.

The magnetic sensor device 200 according to Embodiment 2 can also apply a larger magnetic field in the transport direction (X-direction) in the transport path 7. This increases a change in the magnetic field in the transport direction (X-direction) outputted by a magnetoresistive element. In addition, the first magnetic field generator 1a and the second magnetic field generator 1b are positioned easily.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2020-060272, filed on Mar. 30, 2020, the entire disclosure of which is incorporated by reference herein.

REFERENCE SIGNS LIST

1a First magnetic field generator
1b Second magnetic field generator
2a First magnetoresistive element
3a Housing
3b Housing
4a Metal shield plate
4b Metal shield plate
5a Circuit board
5b Circuit board
6a Signal processing circuit board
6b Signal processing circuit board
7 Transport path
8 Detection object
9a Cable
9b Cable
10a Center line
10b Center line
10c Center line
10d Center line
10e Center line
11 Fixture
100 Magnetic sensor device
200 Magnetic sensor device

The invention claimed is:

1. A magnetic sensor device comprising:
a first magnetic field generator having a pair of magnetic poles, the first magnetic field generator being configured to generate a magnetic field intersecting a detection object being transported along a transport path;
a second magnetic field generator is disposed at opposite side to the first magnetic field generator with respect to the transport path and having a pair of magnetic poles, the second magnetic field generator being configured to generate a magnetic field intersecting the detection object; and
a first magnetoresistive element disposed between the first magnetic field generator and the transport path, the first magnetoresistive element being configured to output, as a change in resistance, a change in magnetic flux density produced by transport of the detection object along the transport path, wherein
a direction from a south pole toward a north pole of the first magnetic field generator and a direction from a south pole toward a north pole of the second magnetic field generator are perpendicular to a transport direction of the detection object,
the first magnetic field generator and the second magnetic field generator are different in a magnetic pole thereof facing the transport path,
the first magnetic field generator and the second magnetic field generator are arranged such that a first center line as a center of the first magnetic field generator in the transport direction and a second center line as a center of the second magnetic field generator in the transport direction are located at mutually different positions in the transport direction,
the first magnetoresistive element includes a first resistor and a second resistor arranged in the transport direction, and
the first resistor and the second resistor are arranged with spacing therebetween, and a midpoint of the spacing in the transport direction is located at a position different from the position of the center of the first magnetic field generator in the transport direction.

2. The magnetic sensor device according to claim 1, wherein the first magnetic field generator and the second magnetic field generator is disposed to face each other partially in the transport direction across the transport path.

3. The magnetic sensor device according to claim 2, wherein the first magnetoresistive element is arranged such that the midpoint of the spacing between the first resistor and the second resistor in the transport direction is farther from the center of the second magnetic field generator in the transport direction than from the center of the first magnetic field generator in the transport direction.

4. The magnetic sensor device according to claim 3, further comprising:
a fixture connected to an end of the first magnetic field generator in a direction intersecting the transport direction and an end of the second magnetic field generator in the direction intersecting the transport direction, the fixture being formed from a non-magnetic material.

5. The magnetic sensor device according to claim 2, further comprising:
a second magnetoresistive element disposed between the second magnetic field generator and the transport path, the second magnetoresistive element being configured to output, as a change in resistance, a change in magnetic flux density produced by transport of the detection object along the transport path, wherein
the second magnetoresistive element includes a third resistor and a fourth resistor arranged in the transport direction, and
the third resistor and the fourth resistor are arranged with spacing therebetween, and a midpoint of the spacing in the transport direction is located at a position different from the position of the center of the second magnetic field generator in the transport direction.

6. The magnetic sensor device according to claim 5, wherein the second magnetoresistive element is arranged such that the midpoint of the spacing between the third resistor and the fourth resistor in the transport direction is farther from the center of the first magnetic field generator in the transport direction than from the center of the second magnetic field generator in the transport direction.

7. The magnetic sensor device according to claim 6, further comprising:
a fixture connected to an end of the first magnetic field generator in a direction intersecting the transport direction and an end of the second magnetic field generator in the direction intersecting the transport direction, the fixture being formed from a non-magnetic material.

8. The magnetic sensor device according to claim 5, further comprising:
a fixture connected to an end of the first magnetic field generator in a direction intersecting the transport direction and an end of the second magnetic field generator in the direction intersecting the transport direction, the fixture being formed from a non-magnetic material.

9. The magnetic sensor device according to claim 2, further comprising:
a fixture connected to an end of the first magnetic field generator in a direction intersecting the transport direction and an end of the second magnetic field generator in the direction intersecting the transport direction, the fixture being formed from a non-magnetic material.

10. The magnetic sensor device according to claim 1, wherein the first magnetoresistive element is arranged such that the midpoint of the spacing between the first resistor and the second resistor in the transport direction is farther from the center of the second magnetic field generator in the transport direction than from the center of the first magnetic field generator in the transport direction.

11. The magnetic sensor device according to claim 10, further comprising:
a second magnetoresistive element disposed between the second magnetic field generator and the transport path, the second magnetoresistive element being configured to output, as a change in resistance, a change in magnetic flux density produced by transport of the detection object along the transport path, wherein
the second magnetoresistive element includes a third resistor and a fourth resistor arranged in the transport direction, and
the third resistor and the fourth resistor are arranged with spacing therebetween, and a midpoint of the spacing in the transport direction is located at a position different from the position of the center of the second magnetic field generator in the transport direction.

12. The magnetic sensor device according to claim 11, wherein the second magnetoresistive element is arranged such that the midpoint of the spacing between the third resistor and the fourth resistor in the transport direction is farther from the center of the first magnetic field generator in the transport direction than from the center of the second magnetic field generator in the transport direction.

13. The magnetic sensor device according to claim 12, further comprising:
a fixture connected to an end of the first magnetic field generator in a direction intersecting the transport direction and an end of the second magnetic field generator in the direction intersecting the transport direction, the fixture being formed from a non-magnetic material.

14. The magnetic sensor device according to claim 11, further comprising:
a fixture connected to an end of the first magnetic field generator in a direction intersecting the transport direction and an end of the second magnetic field generator in the direction intersecting the transport direction, the fixture being formed from a non-magnetic material.

15. The magnetic sensor device according to claim 10, further comprising:
a fixture connected to an end of the first magnetic field generator in a direction intersecting the transport direction and an end of the second magnetic field generator in the direction intersecting the transport direction, the fixture being formed from a non-magnetic material.

16. The magnetic sensor device according to claim 1, further comprising:
a second magnetoresistive element disposed between the second magnetic field generator and the transport path, the second magnetoresistive element being configured to output, as a change in resistance, a change in magnetic flux density produced by transport of the detection object along the transport path, wherein
the second magnetoresistive element includes a third resistor and a fourth resistor arranged in the transport direction, and
the third resistor and the fourth resistor are arranged with the spacing therebetween, and a midpoint of the spacing in the transport direction is located at a position different from the position of the center of the second magnetic field generator in the transport direction.

17. The magnetic sensor device according to claim 16, wherein the second magnetoresistive element is arranged such that the midpoint of the spacing between the third resistor and the fourth resistor in the transport direction is farther from the center of the first magnetic field generator in the transport direction than from the center of the second magnetic field generator in the transport direction.

18. The magnetic sensor device according to claim 17, further comprising:
a fixture connected to an end of the first magnetic field generator in a direction intersecting the transport direction and an end of the second magnetic field generator in the direction intersecting the transport direction, the fixture being formed from a non-magnetic material.

19. The magnetic sensor device according to claim 16, further comprising:
a fixture connected to an end of the first magnetic field generator in a direction intersecting the transport direction and an end of the second magnetic field generator in the direction intersecting the transport direction, the fixture being formed from a non-magnetic material.

20. The magnetic sensor device according to claim 1, further comprising:
a fixture connected to an end of the first magnetic field generator in a direction intersecting the transport direction and an end of the second magnetic field generator in the direction intersecting the transport direction, the fixture being formed from a non-magnetic material.

* * * * *